(12) United States Patent
Yoo

(10) Patent No.: US 7,687,995 B2
(45) Date of Patent: Mar. 30, 2010

(54) DISPLAY APPARATUS

(75) Inventor: Young-Gil Yoo, Suwon-si (KR)

(73) Assignee: Samsung SDI Co., Ltd. (KR)

(*) Notice: Subject to any disclaimer, the term of this patent is extended or adjusted under 35 U.S.C. 154(b) by 345 days.

(21) Appl. No.: 11/657,786

(22) Filed: Jan. 24, 2007

(65) Prior Publication Data

US 2007/0247053 A1  Oct. 25, 2007

(30) Foreign Application Priority Data

Jan. 27, 2006  (KR) .............. 10-2006-0009027

(51) Int. Cl.
*H01J 17/49*  (2006.01)
(52) U.S. Cl. ..................... 313/583; 313/582
(58) Field of Classification Search .......... 313/582–587
See application file for complete search history.

(56) References Cited

U.S. PATENT DOCUMENTS

2005/0117285 A1* 6/2005 Bang et al. ................ 361/681
2005/0190175 A1* 9/2005 Kim et al. ................ 345/204
2005/0195488 A1* 9/2005 McCabe et al. ............ 359/603
2005/0286228 A1* 12/2005 Kim ........................... 361/704
2006/0093782 A1* 5/2006 Sano et al. ................... 428/90

* cited by examiner

*Primary Examiner*—Bumsuk Won
(74) *Attorney, Agent, or Firm*—Knobbe Martens Olson & Bear LLP

(57) ABSTRACT

Provided is a display apparatus that includes a panel assembly having a front panel and a rear panel coupled to the front panel and a plurality of discharge electrodes to which power is applied; a chassis base assembly that is combined with the panel assembly and on which a driving circuit unit is formed; a plurality of signal transmitting units that electrically connect the discharge electrodes and the driving circuit unit; and a silicon protection member which is formed on at least an end of each of the signal transmitting units to surround connection portions between the signal transmitting units and the discharge electrodes of the driving circuit unit, and comprises a silicon layer that seals the connection portions from the outside and an electromagnetic wave shielding material that is mixed in the silicon layer to block electromagnetic waves generated by the discharge electrodes or the driving circuit unit and has an electromagnetic wave shielding range from 1 to 200 dB. The display apparatus can prevent yellowing, and at the same time, can block electromagnetic waves.

12 Claims, 3 Drawing Sheets

DISPLAY APPARATUS

CROSS-REFERENCE TO RELATED PATENT APPLICATION

This application claims the benefit of Korean Patent Application No. 10-2006-0009027, filed on Jan. 27, 2006, in the Korean Intellectual Property Office, the disclosure of which is incorporated herein in its entirety by reference.

BACKGROUND OF THE INVENTION

1. Field of the Invention

The present embodiments relate to a display apparatus, and more particularly, to a display apparatus having a structure that can prevent electronic parts from being corroded at portions where a signal transmitting unit is electrical connected and can block electromagnetic waves.

2. Description of the Related Art

Display apparatuses can typically be categorized as emissive display devices and passive display devices.

Emissive display devices include cathode ray tubes (CRTs), plasma display panels (PDPs), electro luminescent displays, vacuum fluorescent displays, and light emitting diodes, and passive display devices include liquid crystal display (LCD) devices.

Of the devices, the PDP is a flat panel display device that displays desired numbers, letters, or graphics using visible light emitted from phosphor layers which are excited by ultraviolet rays generated during a gas discharge which is generated by a direct or alternate current voltage applied to a plurality of electrodes formed on a plurality of substrates after a discharge gas is sealed between the plurality of substrates.

A conventional PDP includes a panel assembly, a chassis base assembly combined with the panel assembly, and a case that accommodates the panel assembly and the chassis base assembly. Also, the conventional PDP includes discharge electrodes disposed in the panel assembly and a signal transmitting unit that transmits electrical signals to a driving circuit unit included in the chassis base assembly. An end of the signal transmitting unit is electrically connected to terminals of the discharge electrodes of the conventional PDP and another end of the signal transmitting unit is connected to circuit devices of the driving circuit unit.

However, the conductive material that constitutes the discharge electrodes of the conventional PDP often corrodes since the conductive material sulfurizes as time passes due to sulfur compounds in the air or exhaust gases. Furthermore, electromagnetic waves are generated during operation at the portion where the signal transmitting unit is connected to the discharge electrodes of the conventional PDP or to the driving circuit unit.

SUMMARY OF THE INVENTION

The present embodiments provide a display apparatus having an improved structure that can prevent corrosion of a connection portion between a signal transmitting unit and other elements.

The present embodiments also provide a display apparatus having a structure that can block electromagnetic waves generated at a connection portion between a signal transmitting unit and other elements.

According to an aspect of the present embodiments, there is provided a display apparatus comprising: a panel assembly having a front panel and a rear panel coupled to the front panel and a plurality of discharge electrodes to which power is applied; a chassis base assembly that is combined with the panel assembly and on which a driving circuit unit is formed; a plurality of signal transmitting units that electrically connect the discharge electrodes and the driving circuit unit; and a silicon protection member which is formed on at least an end of each of the signal transmitting units to surround connection portions between the signal transmitting units and the discharge electrodes of the driving circuit unit, and comprises a silicon layer that seals the connection portions from the outside and an electromagnetic wave shielding material that is mixed in the silicon layer to block electromagnetic waves generated by the discharge electrodes or the driving circuit unit and has an electromagnetic wave shielding range from 1 to 200 dB.

Each of the signal transmitting units may comprise a driving IC, a lead electrically connected to the driving IC, and a flexible film that surrounds the lead.

The silicon protection member may surround connected portions between the leads and the discharge electrodes.

The electromagnetic wave shielding material may be Au, Ag, Cu, Al, Ni, Fe, C, or an alloy formed of at least two of these metals.

The electromagnetic wave shielding material may comprise a conductive material from 0.5 to 90 wt % of the electromagnetic wave shielding material.

The electromagnetic wave shielding material may have a volume resistivity of $1 \times 10^9$ $\Omega \cdot$cm.

The display apparatus may further comprise an electromagnetic wave shielding filter in front of the panel assembly.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

A display apparatus according to the present embodiments will now be described more fully with reference to the accompanying drawings in which exemplary embodiments are shown.

Figure 1:
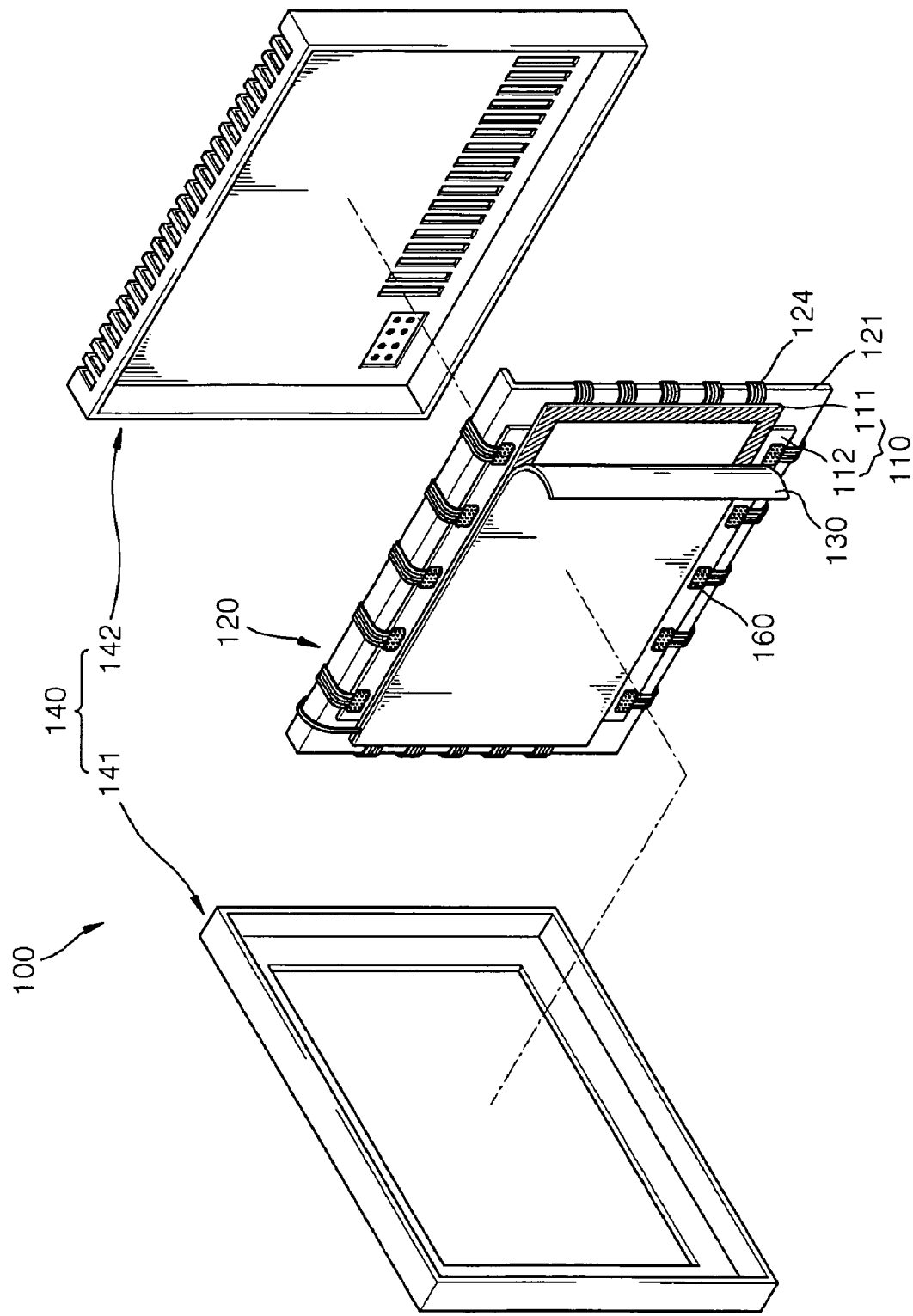
FIG. 1 is an exploded perspective view illustrating a display apparatus according to an embodiment.
Figure 2:
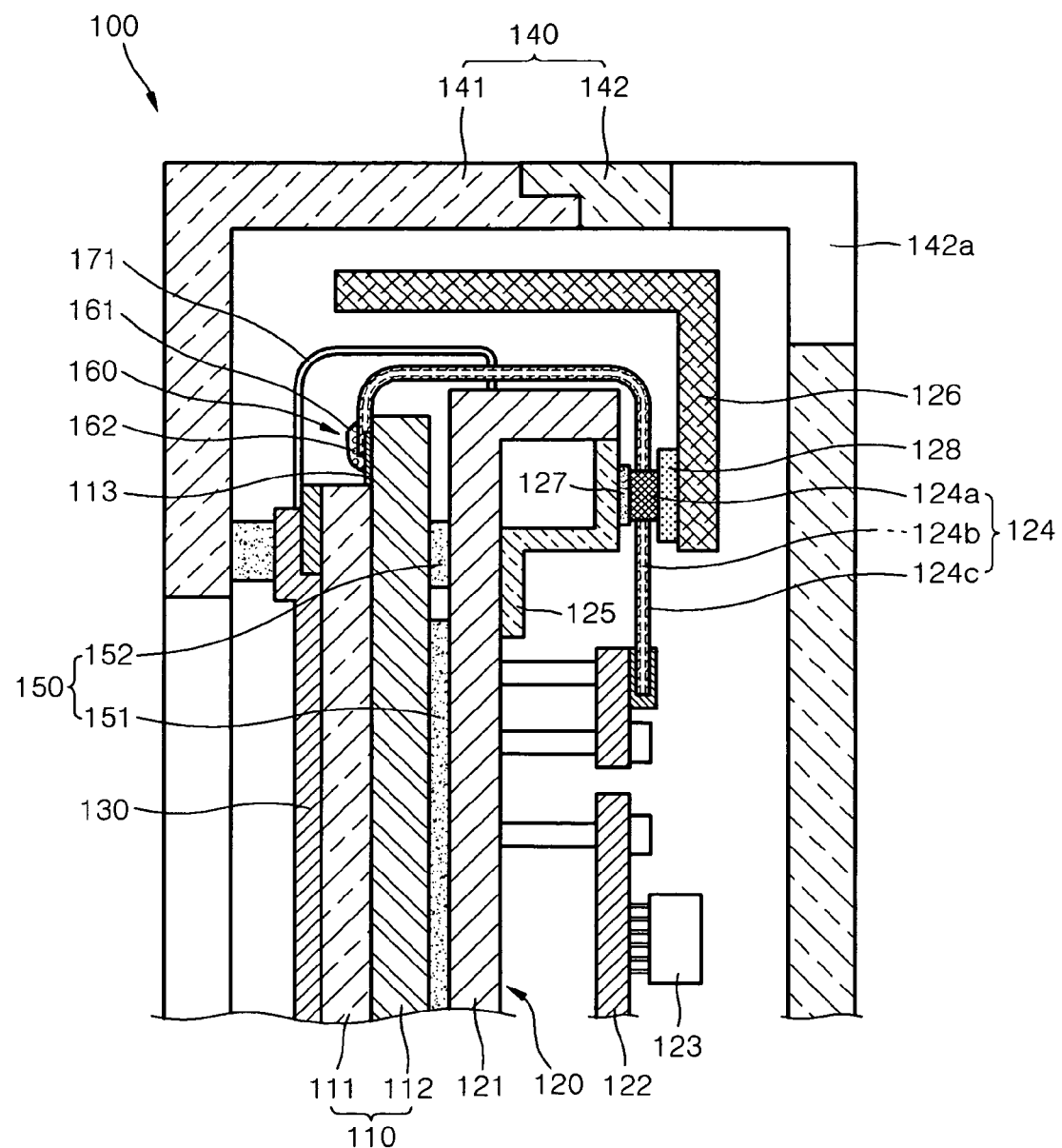
FIG. 2 is a cross-sectional view illustrating the display apparatus of FIG. 1 in a combined state, according to an embodiment.

FIG. 1 is an exploded perspective view illustrating a plasma display panel (PDP) 100 according to an embodiment. FIG. 2 is a cross-sectional view illustrating the PDP 100 of FIG. 1 in a combined state and FIG. 3 is an enlarged plan view illustrating silicon protection members 160 of the PDP 100 of FIG. 1, according to an embodiment.

Figure 3:
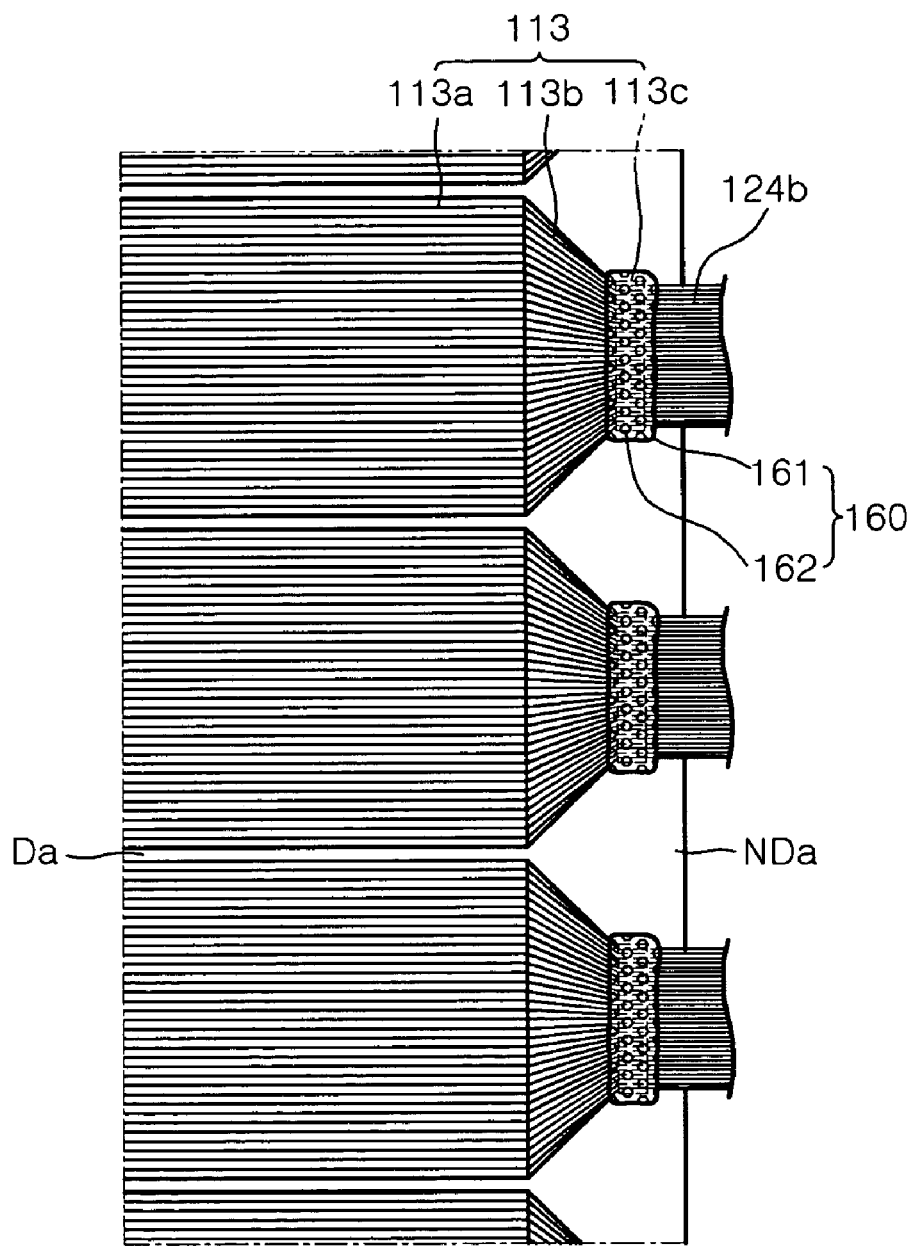
FIG. 3 illustrates an enlarged plan view illustrating a silicon protection unit of the display apparatus of FIG. 1, according to an embodiment.

Referring to FIGS. 1 through 3, the PDP 100 includes a panel assembly 110, a chassis base assembly 120 combined with the rear of the panel assembly 110, a filter assembly 130 attached to the front of the panel assembly 110, and a case 140 that accommodates the panel assembly 110, the chassis base assembly 120, and the filter assembly 130.

The panel assembly 110 includes a front panel 111 and a rear panel 112 combined with the front panel 111. The front panel 111 and a rear panel 112 are combined with each other by a sealant (not shown) coated on inner edge surfaces of the front and rear panels 111 and 112.

The chassis base assembly 120 is combined with the rear of the panel assembly 110. That is, a chassis base 121 is disposed on the rear of the rear panel 112. The chassis base 121 is combined with the panel assembly 110 by an adhesion element 150 (see FIG. 2)

The adhesion element 150 includes a heat dissipation sheet 151 that is attached to the central portion of the rear panel 112 and dissipates heat generated by the panel assembly 110 during operation to the chassis base 121 and a double-sided tape 152 that is attached to the rear panel 112 along rear edges of the rear panel 112 to fix the chassis base 121 with the panel assembly 110.

A driving circuit unit 122 is disposed on the rear surface of the chassis base 121. The driving circuit unit 122 includes at least one circuit device 123. An end of a signal transmitting unit 124 is electrically connected to the circuit devices 123 and another end of the signal transmitting unit 124 is connected to discharge electrodes 113 of the panel assembly 110 to transmit electrical signals between the panel assembly 110 and the driving circuit unit 122.

Chassis reinforcing members 125 are attached to upper and lower edges of the rear surface of the chassis base 121 to reinforce the chassis base 121. Cover plates 126 are installed on the rear of upper and lower edges of the chassis base 121 to protect the signal transmitting unit 124.

The signal transmitting unit 124 includes a driving IC 124a, a lead 124b connected to the driving IC (integrated circuit) 124a, and a flexible film 124c that surrounds the lead 124b.

The signal transmitting unit 124 is interposed between the chassis base 121 and the cover plates 126. A thermal grease 127 is interposed between the driving IC 124a and the chassis reinforcing member 125. A silicon sheet 128 is interposed between the driving IC 124a and the cover plates 126.

The filter assembly 130 is attached to the front surface of the panel assembly 110. The filter assembly 130 is formed by stacking a plurality of films in order to block the reflection of electromagnetic waves, infrared rays, neon glow, or external light.

The panel assembly 110, the chassis base assembly 120, and the filter assembly 130 are accommodated in the case 140. The case 140 consists of a front cabinet 141 installed in front of the filter assembly 130 and a back cover 142 installed on the rear of the chassis base assembly 120. A plurality of ventilation holes 142a are formed on upper and lower portions of the back cover 142.

Silicon protection members 160 are formed on portions of the signal transmitting unit 124 connected to terminal units 113c (see FIG. 3) of the discharge electrodes 113 or circuit devices 123 of the driving circuit unit 122. The silicon protection members 160 include a silicon layer 161 that can seal the connection portions from the outside and an electromagnetic wave shielding material 162 included in the silicon layer 161 to block electromagnetic waves generated by the terminal units 113c of the discharge electrodes 113 or circuit devices 123 of the driving circuit unit 122.

The plurality of patterned discharge electrodes 113 to which a predetermined voltage is applied are formed on an inner surface of the front panel 111 or the rear panel 112. The discharge electrodes 113 can be patterned to various shapes according to a method of designing the PDP 100.

The discharge electrodes 113 includes a discharge unit 113a disposed on a display region Da of the PDP 100, a connection unit 113b leaded out from the discharge unit 113a to a non-display region NDa of the PDP 100, and the terminal unit 113c that is connected as one unit to the discharge unit 113a by the connection unit 113b. The terminal unit 113c is located in the non-display region NDa and is electrically connected to the lead 124b included in the signal transmitting unit 124.

The silicon protection members 160 are coated on the region where the terminal unit 113c and the lead 124b are electrically connected. The silicon protection members 160 protect the terminal unit 113c from sulfurizing as time passes due to sulfur compounds or exhaust gases in the air, and are formed in each region where the terminal unit 113c and the lead 124b are connected.

Accordingly, in upper and lower or left and right edges of the non-display region NDa of the panel assembly 110, the silicon protection members 160 are formed in every region where the lead 124b and the terminal unit 113c are connected. Alternately, the silicon protection members 160 can also be formed in a region where the lead 124b and the circuit device 123 of the driving circuit unit 122 are electrically connected.

The silicon protection members 160 include the silicon layer 161 that is formed on the non-display region NDa to seal a region where the terminal unit 113c and the lead 124b are connected.

The electromagnetic wave shielding material 162 is mixed with the silicon layer 161. The electromagnetic wave shielding material 162 may be a highly conductive material, for example, Au, Ag, Cu, Al, Ni, Fe, C, or an alloy formed of at least two of these materials. The content of the electromagnetic wave shielding material 162 in the silicon protection members 160 is from about 0.5 to about 90 wt %.

The composition of the electromagnetic wave shielding material 162 is related to a shielding range of electromagnetic waves emitted laterally and to the edges of the panel assembly 110. The shielding range of the electromagnetic waves is from about 1 to about 200 dB, preferably, from about 20 to about 80 dB, or can be obtained by the following equation.

$$\text{Shielding effect (dB)} = 20 \times \log_{10} E1/E2$$

where E1 is the intensity of an electromagnetic field before shielding, and E2 is the intensity of an electromagnetic field after the silicon protection members 160 are formed.

Also, the silicon protection members 160 may have a volume resistivity of about $1 \times 10^9$ Ω·cm or more since there is a possibility of disconnection when the terminal unit 113c and the lead 124b are connected due to the electromagnetic wave shielding material 162.

The electromagnetic wave shielding material 162 can be included in the silicon layer 161 by various manufacturing methods. That is, the silicon protection members 160 can be formed by mixing the electromagnetic wave shielding material 162 such as Au, Ag, Cu, Al, Ni, Fe, C, or an alloy formed of at least two of these materials with the silicon layer 161. Alternatively, the silicon protection members 160 can be formed by coating a liquid state of the electromagnetic wave shielding material 162 on a surface of the silicon layer 161. Alternatively, the silicon protection members 160, that is, a conductive silicon pressed product having elasticity, can be formed by covering a braided conductive material, such as braided Cu or Fe, on a surface of the silicon layer 161.

When the silicon layer 161 combines with the electromagnetic wave shielding material 162, the electromagnetic wave shielding material 162 can absorb electromagnetic waves generated by the panel assembly 110, and can protect against static electricity and can prevent electrification.

The filter assembly 130 is attached to the front of the panel assembly 110. The filter assembly 130 can increase the efficiency of electromagnetic waves by stacking a plurality of films such as electromagnetic wave shielding films, infrared ray shielding films, neon glow shielding films, and external light reflection shielding films.

In the PDP 100 having the above structure, electromagnetic waves are generated by the panel assembly 110 or the driving circuit unit 122. The generated electromagnetic waves are grounded to the chassis base 121 through a grounding line 171 after the electromagnetic waves are induced by an electromagnetic wave shielding filter included in the filter assembly 130 that is directly attached to the front surface of the front panel 111.

The electromagnetic waves are additionally shielded by the silicon protection members 160 that seal portions where the terminal unit 113c of the discharge electrodes 113 and the lead 124b of the signal transmitting unit 124 contact each other.

As described above, a display apparatus according to the present embodiments prevents yellowing or sulfurizing by coating a silicon protection member on a region where signal transmitting units are electrically connected to discharge electrodes, and blocks electromagnetic waves since an electromagnetic wave shielding material is included in the PDP.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A display apparatus comprising:
a panel assembly having a front panel and a rear panel coupled to the front panel and a plurality of discharge electrodes;
a chassis base assembly that is combined with the panel assembly and on which a driving circuit unit is formed;
a plurality of signal transmitting units that electrically connect the discharge electrodes and the driving circuit unit; and
a silicon protection member which is formed on at least one end of at least one of the signal transmitting units configured to surround connection portions between the signal transmitting units and the discharge electrodes of the driving circuit unit,
wherein the silicon protection member comprises a silicon layer that seals the connection portions from the outside and an electromagnetic wave shielding material that is mixed with the silicon layer configured to block electromagnetic waves generated by the discharge electrodes or the driving circuit unit and;
wherein the silicon protection member has an electromagnetic wave shielding range from about 1 to about 200 dB.

2. The display apparatus of claim 1, wherein each of the signal transmitting units comprises a driving IC, a lead electrically connected to the driving IC, and a flexible film that surrounds the lead.

3. The display apparatus of claim 2, wherein the silicon protection member surrounds connected portions between the leads and the discharge electrodes.

4. The display apparatus of claim 1, wherein the electromagnetic wave shielding material comprises Au, Ag, Cu, Al, Ni, Fe, C, or an alloy thereof.

5. The display apparatus of claim 1, wherein the electromagnetic wave shielding material comprises a conductive material at from about 0.5 to about 90 wt % of the electromagnetic wave shielding material.

6. The display apparatus of claim 1, wherein the electromagnetic wave shielding material has a volume resistivity of about $1 \times 10^9$ Ω·cm.

7. The display apparatus of claim 1, wherein the electromagnetic wave shielding material is formed by coating the electromagnetic wave shielding material in a mixed state with the silicon layer.

8. The display apparatus of claim 1, wherein the electromagnetic wave shielding material is formed by coating the electromagnetic wave shielding material in a liquid state on the surface of the silicon layer.

9. The display apparatus of claim 1, wherein the electromagnetic wave shielding material is a pressed product formed by covering a braided conductive material on the surface of the silicon layer.

10. The display apparatus of claim 1, further comprising an electromagnetic wave shielding filter in front of the panel assembly.

11. The display apparatus of claim 10, wherein the electromagnetic wave shielding filter is attached to the front surface of the front panel.

12. The display apparatus of claim 10, wherein the electromagnetic wave shielding filter is electrically grounded to the chassis base assembly by a grounding line.

* * * * *